(12) United States Patent
Schaefer et al.

(10) Patent No.: US 11,402,430 B2
(45) Date of Patent: Aug. 2, 2022

(54) SIGNAL ANALYZER AND METHOD OF ANALYZING A SIGNAL

(71) Applicant: Rohde & Schwarz GmbH & Co. KG, Munich (DE)

(72) Inventors: Andrew Schaefer, Munich (DE); Thomas Kuhwald, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 355 days.

(21) Appl. No.: 16/746,607

(22) Filed: Jan. 17, 2020

(65) Prior Publication Data
US 2021/0223312 A1 Jul. 22, 2021

(51) Int. Cl.
| | |
|---|---|
| H03M 1/66 | (2006.01) |
| G01R 31/317 | (2006.01) |
| H03M 1/06 | (2006.01) |
| H03M 1/12 | (2006.01) |

(52) U.S. Cl.
CPC .... *G01R 31/31708* (2013.01); *H03M 1/0626* (2013.01); *H03M 1/1215* (2013.01)

(58) Field of Classification Search
CPC .......... G01R 31/31708; H03M 1/0626; H03M 1/1215; H03M 1/0624; H03M 1/66
USPC ....................................................... 341/144
See application file for complete search history.

(56) References Cited

U.S. PATENT DOCUMENTS

| | | | |
|---|---|---|---|
| 5,978,742 A | 11/1999 | Pickerd | |
| 7,058,548 B2 * | 6/2006 | Pupalaikis | G01R 13/0272 341/126 |
| 7,139,684 B2 * | 11/2006 | Pupalaikis | H03M 1/121 341/126 |
| 7,219,037 B2 * | 5/2007 | Pupalaikis | H03M 1/121 341/126 |
| 7,222,055 B2 * | 5/2007 | Pupalaikis | G01R 13/0272 341/126 |
| 7,373,281 B2 * | 5/2008 | Pupalaikis | G01R 19/25 341/126 |
| 7,519,513 B2 * | 4/2009 | Pupalaikis | H03M 1/121 341/126 |
| 7,653,514 B2 * | 1/2010 | Pupalaikis | H03M 1/121 341/126 |

(Continued)

FOREIGN PATENT DOCUMENTS

| | | |
|---|---|---|
| DE | 102014203369 A1 | 8/2015 |
| EP | 2453577 A1 | 5/2012 |

*Primary Examiner* — Jean B Jeanglaude
(74) *Attorney, Agent, or Firm* — Christensen O'Connor Johnson Kindness PLLC

(57) ABSTRACT

A signal analyzer for analyzing a signal includes a frontend with at least two interleaved digitizers configured to digitize an input signal, thereby generating a digitized input signal. The signal analyzer also includes a first interleave alignment filter established by a hardware interleave alignment filter that is configured to hardware-compensate non-ideal effects of the frontend in the digitized input signal in real-time, thereby generating a hardware-compensated, digitized input signal. Further, the signal analyzer includes an acquisition memory configured to store the hardware-compensated, digitized input signal, thereby acquiring an acquired signal. Moreover, the signal analyzer includes a second interleave alignment filter configured to fine-compensate further non-ideal effects of the frontend in a post-processing of the acquired signal.

20 Claims, 1 Drawing Sheet

(56) References Cited

U.S. PATENT DOCUMENTS

| | | | |
|---|---|---|---|
| 8,073,656 B2* | 12/2011 | Pupalaikis | H05K 999/99 341/126 |
| 9,325,342 B2* | 4/2016 | Pupalaikis | H03M 1/60 |
| 10,333,540 B2* | 6/2019 | Pupalaikis | H03M 1/121 |
| 10,659,071 B2* | 5/2020 | Pupalaikis | H03M 1/60 |
| 2004/0174284 A1* | 9/2004 | Pupalaikis | H03M 1/1038 341/141 |

* cited by examiner

SIGNAL ANALYZER AND METHOD OF ANALYZING A SIGNAL

FIELD OF THE DISCLOSURE

Embodiments of the present disclosure generally relate to a signal analyzer for analyzing a signal. Further, embodiments of the present disclosure generally relate to a method of analyzing a signal.

BACKGROUND

Signal analyzers are known that receive an input signal that is internally processed in order to obtain an acquired signal. Afterwards, the acquired signal is typically exposed to corrective processes such as a de-embedding and an interleave alignment filtering for compensating any non-ideal effects introduced by a frontend of the respective signal analyzer. These non-ideal effects may correspond to a time delay and/or a dispersion of the respective input signal to be processed. Thus, it is known in the state of the art that the corrective processes, namely the de-embedding and the interleave alignment filtering, are performed in a post-processing of the already acquired signal.

Accordingly, raw data assigned to the input signal is used for triggering the acquisition of the input signal. Thus, only raw data of the input signal is acquired. Since the respective corrective processes, namely the de-embedding and the interleave alignment filtering, are only performed in the post-processing of the already acquired signal, the respective correction is done after acquiring the raw data.

However, this may result in trigger events detected based on the raw data having the non-ideal effects, which are false such that data is acquired that does not relate to a real trigger event when taking corrected data of the input signal into account, namely data without any non-ideal effects such as time delay and/or dispersion.

SUMMARY

Accordingly, there is a need for a signal analyzer as well as a method of analyzing a signal, which overcome the above-mentioned drawbacks.

Embodiments of the present disclosure provide a signal analyzer for analyzing a signal. In an embodiment, the signal analyzer comprises a frontend with at least two interleaved digitizers configured to digitize an input signal, thereby generating a digitized input signal. The signal analyzer also comprises a first interleave alignment filter established by a hardware interleave alignment filter that is configured to hardware-compensate non-ideal effects of the frontend in the digitized input signal in real-time, thereby generating a hardware-compensated, digitized input signal. The signal analyzer also comprises an acquisition memory configured to store the hardware-compensated, digitized input signal, thereby generating an acquired signal. Moreover, the signal analyzer comprises a second interleave alignment filter configured to fine-compensate further non-ideal effects of the frontend in a post-processing of the acquired signal.

Further, embodiments of the present disclosure provide a method of analyzing a signal. In an embodiment, the method comprises the steps of:
receiving an input signal by a frontend of a signal analyzer,
digitizing the input signal by the frontend, thereby generating a digitized input signal,
filtering the digitized input signal by a first interleave alignment filter in order to hardware-compensate non-ideal effects of the frontend in the digitized input signal in real-time, thereby generating a hardware-compensated, digitized input signal,
storing the hardware-compensated, digitized input signal by an acquisition memory, thereby generating an acquired signal, and
filtering the acquired signal by a second interleave alignment filter in order to fine-compensate further non-ideal effects of the frontend in a post-processing of the acquired signal.

The present disclosure is based on the finding that a (rough) correction takes place in an acquisition path of the signal analyzer in real-time. In other words, the signal processed, namely a representative of the input signal, for example the digitized input signal, is corrected at least partly in the acquisition path, namely the portion of the signal analyzer located upstream of the acquisition memory. For example, an interleave alignment correction, namely the interleave alignment filtering, is done in the acquisition path by the first interleave alignment filter that is located upstream of the acquisition memory.

In addition, a second interleave alignment filter is provided that is located downstream of the acquisition memory such that a representative of the input signal, namely the acquired signal, is also corrected by the second interleave alignment filter. The second interleave alignment filter is assigned to a post-processing of the already acquired signal in contrast to the first interleave alignment filter that is assigned to the acquisition path prior to the acquisition.

Generally, the input signal or a representative thereof is corrected at least twice by the first interleave alignment filter and the second interleave alignment filter. The respective correction takes place prior to the acquisition and after the acquisition.

In some embodiments, a (rough or fast) correction is performed in the acquisition path enabling the real-time processing, whereas a (fine or a more time-consuming) correction is performed on the already acquired signal, namely downstream of the acquisition memory, ensuring an optimized correction. Hence, the post-processing, namely the fine compensation done by the second interleave alignment filter, may take more time compared to the filtering or (rough) compensation done by the first interleave alignment filter. The first interleave alignment filter performs a (relatively) limited correction due to the temporal restrictions still ensuring real-time processing during the acquisition.

Accordingly, a trade-off between accuracy of the filtering and the time required is done. The digitized input signal is hardware-compensated by the first interleave alignment filter as good as possible in the respective time available that still ensures real-time processing, whereas the fine compensation is done by the second interleave alignment filter afterwards in a post-processing since time is not critical in post-processing. However, the (rough or fast) correction provides a reasonable basis of data, for example when compared to raw data.

The fine compensation does not necessarily have to be done in real-time. Thus, the fine compensation may be done by software. However, the fine compensation may also be established by hardware.

Generally, the non-ideal effects have been introduced by the frontend when processing the input signal, for example the interleaved digitizers. For example, the interleave digitizers relate to time-interleaved digitizers, which may introduce non-ideal effects when processing the input signal in order to generate the digitized input signal. The non-ideal effects may correspond to a time delay and/or a dispersion.

Advantageously, all non-ideal effects introduced should be compensated. However, the first interleave alignment filter is only able to partly compensate or correct all of the occurring non-ideal effects when processing the digitized input signal since the first interleave alignment filter has to process the digitized input signal in real-time. Therefore, the second interleave alignment filter is provided additionally, which fine-compensates further non-ideal effects when post-processing the acquired signal, for example the rest of the non-ideal effects not corrected by the first interleave alignment filter. As mentioned above, the post-processing may last longer as time is not critical in post-processing. Therefore, more complex corrections may be performed during the fine compensation.

As the second interleave alignment filter is located downstream of the acquisition memory, the second interleave alignment filter obtains the already acquired signal from the acquisition memory. The acquired signal was acquired based on a pre-corrected signal, namely the signal processed by the first interleave alignment filter. Therefore, the post-processing is already improved compared to a post-processing of raw data acquired.

Generally, the input signal is processed by different components of the signal analyzer, yielding a respective representative of the input signal, for instance a digitized input signal or a hardware-compensated, digitized input signal.

However, each of these different signals obtained by the respective processing, namely the representatives of the input signal, relate to the input signal.

In general, the at least two interleaved digitizers may be configured to perform a time interleaved sampling (TIS) in order to increase the real-time sample rate, as these digitizers may sample the same input signal at different relative phases. Then, the samples obtained by these digitizers are interleaved in order to create a waveform, namely the digitized input signal, as if only one digitizer was sampling the input signal at a higher sample rate.

The digitizers may also be called analog-to-digital converters (DACs).

According to an aspect, the first interleave alignment filter is interconnected between the frontend and the acquisition memory. Thus, the first interleave alignment filter is located in the acquisition path that ends with the acquisition memory. The first interleave alignment filter receives the already digitized input signal from the front end, for example the at least two interleaved digitizers, as the first interleave alignment filter is located downstream of the frontend. Therefore, the respective non-ideal effects introduced by the frontend, namely the digitizers, can be compensated by the first interleave alignment filter.

According to another aspect, the acquisition memory is interconnected between the first interleave alignment filter and the second interleave alignment filter. The first interleave alignment filter is assigned to a signal processing prior to the signal acquisition (pre-processing), whereas the second interleave alignment filter is assigned to a post-processing of the already acquired signal. Therefore, the entire interleave alignment correction is split into a first portion, namely a rough correction, that is done by the first interleave alignment filter in the pre-processing as well as a second portion, namely a fine correction, that is done by the second interleave alignment filter in the post-processing. Generally, the respective correction of the non-ideal effects may correspond to a respective compensation of the non-ideal effects, namely a rough compensation and a fine compensation, respectively.

Further, the signal analyzer may comprise a first trigger circuit or unit established by a hardware trigger circuit or unit that is interconnected between the first interleave alignment filter and the acquisition memory. The first trigger unit receives the pre-processed, namely the hardware-compensated, digitized input signal, that is outputted by the first interleave alignment filter. The correction done by the first interleave alignment filter provides a reasonable basis of data for the real-time trigger performed by the first trigger unit. The first trigger unit may pre-select trigger events based on the hardware-compensated, digitized input signal. The pre-selection of the trigger events is done in the acquisition path prior to the acquisition of the signal, but after its pre-correction. Thus, the respective trigger is applied on already pre-corrected data rather than raw data assigned to the input signal. The pre-selected trigger events correspond to possible trigger events. Even though the first trigger unit only pre-selects these trigger events, a higher probability is obtained that these pre-selected trigger events correspond to real trigger events due to the pre-correction of the digitized input signal, which is done by the first interleave alignment filter. In some embodiments, the first trigger unit is a digital trigger unit.

A further aspect provides that the signal analyzer comprises a second trigger circuit or unit established by a fine trigger unit that is connected downstream of the acquisition memory. In some embodiments, the second trigger unit is located downstream of the second interleave alignment filter such that the fine-compensated, acquired signal is processed by the second interleave alignment filter. This ensures that the second trigger unit processes a signal without any non-ideal effects introduced by the frontend. The (rough) correction and the fine correction have been performed previously by the first and second interleave alignment filters, respectively. In some embodiments, the second trigger unit is a digital trigger unit.

In some embodiments, the second trigger unit is also assigned to the post-processing of the already acquired signal, as it is located downstream of the acquisition memory. Accordingly, the second trigger unit may verify the (pre-selected) trigger results of the first trigger unit. For example, the second trigger unit can be used to adapt, for example fine calculate, or discard the trigger events provided by the first trigger unit. Hence, the second trigger unit performs the final selection, for example compared to the first trigger unit performing the pre-selection.

Put differently, the second trigger unit verifies whether or not the (pre-selected) trigger events are still valid even after the fine compensation done by the second interleave compensation filter in the post-processing of the acquired signal.

If it is verified that these trigger events are still valid, a possible adaption/correction of the (pre-selected) trigger events will take place, namely a finer calculation of their respective timings, yielding an adapted acquired signal or adapted acquisition data assigned to the input signal.

If it is verified that these trigger events are not valid anymore, the (pre-selected) trigger events (together with the respective acquisition data) will be discarded.

Further, the signal analyzer may comprise a first de-embedding filter established by a hardware de-embedding filter that is interconnected between the first interleave alignment filter and the acquisition memory. Accordingly, a de-embedding of the input signal may take place in the acquisition path in real-time, as the first de-embedding filter is established by a hardware de-embedding filter.

Generally, de-embedding is done to compensate any parasitic effects that may be introduced by (external) components used to receive the input signal, for instance adapters, connectors, wires, cables, and so on. Any parasitic effects introduced are virtually eliminated when de-embedding the respective signal or rather applying a de-embedding filter.

In some embodiments, the signal analyzer comprises a first de-embedding filter established by a hardware de-embedding filter that is interconnected between the first interleave alignment filter and the first trigger unit. The first de-embedding filter is located upstream of the first trigger unit, but downstream of the first interleave alignment filter. Hence, the first trigger unit receives and processes a representative of the input signal that has been de-embedded, hardware-compensated and digitized previously. Put differently, the first trigger unit receives a representative of the input signal that has been corrected with respect to interleave alignment and embedding. Therefore, the trigger is applied on data corrected with respect to two different effects, which improves the data basis for the triggering accordingly.

Moreover, the signal analyzer may comprise a second de-embedding filter established by a fine de-embedding filter that is connected downstream of the acquisition memory. Accordingly, the entire de-embedding is also split into two portions that are done in the pre-processing, namely prior to the signal acquisition, as well as in the post-processing of the already acquired signal. Again, the post-processing, namely the fine de-embedding done by the second de-embedding filter, may take more time compared to the (rough) de-embedding done by the first de-embedding filter in the pre-processing.

However, the (rough) de-embedding done by the first de-embedding filter ensures that the respective signal is pre-corrected in an appropriate manner, improving the probability that the hardware trigger unit identifies possible trigger events with a higher probability in real-time.

In some embodiments, the second de-embedding filter is (directly) interconnected between the acquisition memory and the second interleave alignment filter. Thus, the fine de-embedding takes place prior to the fine compensation of the further non-ideal effects introduced by the frontend.

Generally, the second interleave alignment filter and the second de-embedding filter together may correct the respective signal completely.

Furthermore, the signal analyzer may comprise a second trigger unit established by a fine trigger unit. The second interleave alignment filter is (directly) interconnected between the second trigger unit and the second de-embedding filter. Thus, the second trigger unit is located downstream of the second interleave alignment filter as well as downstream of the second de-embedding filter. This ensures that the second trigger unit that verifies the (pre-selected) trigger events provided by the first trigger unit receives the fine-compensated and fine de-embedded acquired signal.

Accordingly, a completely corrected signal is received by the second trigger unit in order to check the respective (possible) trigger results identified by the first trigger unit based on the (roughly corrected) signal received.

Moreover, the first interleave alignment filter and/or the second interleave alignment filter comprise(s) a periodically time-variant filter, for example. The periodically time-variant filter may comprise several compensation filters. For instance, each of the interleaved digitizers is assigned to a dedicated compensation filter. The sampled values (samples) generated by the digitizers are forwarded to the periodically time-variant filter, wherein each individual compensation filter supplies only compensated samples in an associated polyphase of the digitized input signal.

According to an aspect, the hardware-compensated, digitized input signal is hardware de-embedded by a first de-embedding filter, thereby generating a hardware de-embedded, hardware-compensated, digitized input signal. The de-embedding that is done by the first de-embedding filter takes place in the acquisition path. The de-embedding can be done in real-time, as the first de-embedding filter is established by a hardware de-embedding filter. In some embodiments, the de-embedding takes place downstream of the interleave alignment filtering in the acquisition path, which is done by the first interleave alignment filter.

A trigger may be applied on the hardware de-embedded, hardware-compensated, digitized input signal by a first trigger unit, thereby generating trigger events. The trigger may be applied by the first trigger unit that is also located in the acquisition path. The first trigger unit receives the already hardware-compensated, hardware de-embedded, digitized input signal for applying the respective trigger on that signal being a representative of the input signal. The first trigger unit performs a pre-selection of trigger events, wherein this pre-selection is improved, as it is not performed on raw data associated with the input signal, but on pre-corrected data, namely the hardware-compensated, hardware de-embedded data.

In some embodiments, samples of the hardware de-embedded, hardware-compensated, digitized input signal are acquired by the acquisition memory based on the trigger events, thereby generating the acquired signal. The trigger events generated by the first trigger unit as well as respective samples assigned to the input signal are processed, wherein the acquisition memory may be triggered in case of an occurring (pre-selected) trigger event to store the respective samples associated therewith, for example for post-processing purposes. While storing the respective samples, the acquired signal is generated.

According to another aspect, the acquired signal is de-embedded by second de-embedding filter, thereby generating a de-embedded acquired signal. The de-embedding performed by the second de-embedding filter may relate to a fine de-embedding that is done during a post-processing of the acquired signal. Hence, more time can be spent for correcting the already acquired signal with respect to any parasitic effects introduced by embedding.

The de-embedded acquired signal may be filtered by the second interleave alignment filter, thereby generating a compensated, de-embedded acquired signal. The filtering relates to a fine compensation of further non-ideal effects of the frontend, which is done in the post-processing of the already acquired signal. In an embodiment, the second interleave alignment filter is applied on the previously fine de-embedded acquired signal. Since the second interleave alignment filter is also assigned to the post-processing, the respective interleave alignment correction corresponds to a fine compensation of any further non-ideal effects introduced by the frontend, which have not been compensated previously by the first interleave alignment filter in the acquisition path.

Furthermore, a trigger may be applied on the compensated, de-embedded acquired signal by means of a second trigger unit, thereby generating final trigger results. The trigger applied by the second trigger unit may relate to the trigger applied by the first trigger unit previously. Generally, the second trigger unit verifies the (pre-selected) trigger events obtained from the first trigger unit. For instance, these trigger events are adapted, for example their timings may be fine-calculated, or discarded depending on the outcome of the verification performed by the second trigger unit. As mentioned above, the second trigger unit may apply the same trigger as the first trigger unit. However, the second trigger unit applies this trigger on the fine-compensated, fine de-embedded acquired signal, namely an optimally corrected signal.

In contrast, the first trigger unit applies the trigger on a pre-corrected or rather roughly corrected signal while ensuring real-time processing of the signal.

In addition, the compensated, de-embedded acquired signal and/or the trigger results may be forwarded to the acquisition memory. Thus, the acquisition data can be adapted in an appropriate manner for a further post-processing. For instance, a correction of the trigger events provided by the first trigger unit is done when adapting the acquisition data, yielding adapted acquisition data. In addition, certain trigger events provided by the first trigger unit are cancelled from the acquisition memory provided that the second trigger unit verifies that the pre-selected trigger event are not valid anymore.

This generally ensures that a further post-processing of the acquired data is improved since the data basis for this further post-processing is corrected accordingly.

In some embodiments, acquisition data may be further post-processed. The acquisition data may relate to the adapted acquisition data after having processed the compensated, de-embedded acquired signal and/or the final trigger results obtained by the second trigger unit. On this adapted acquisition data, typical post-processing methods may be applied such as visualizing the acquisition data and/or performing measurements on the acquisition data.

In general, the verification of the trigger events previously determined by the first trigger unit is done in a first post-processing path that is followed by at least one other post-processing path.

The connection of the components of the signal analyzer, for instance the acquisition memory and the interleave alignment filters, may relate to a direct connection without any components interconnected. However, the connection of the components of the signal analyzer may also relate an indirect connection with at least one component interconnected.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
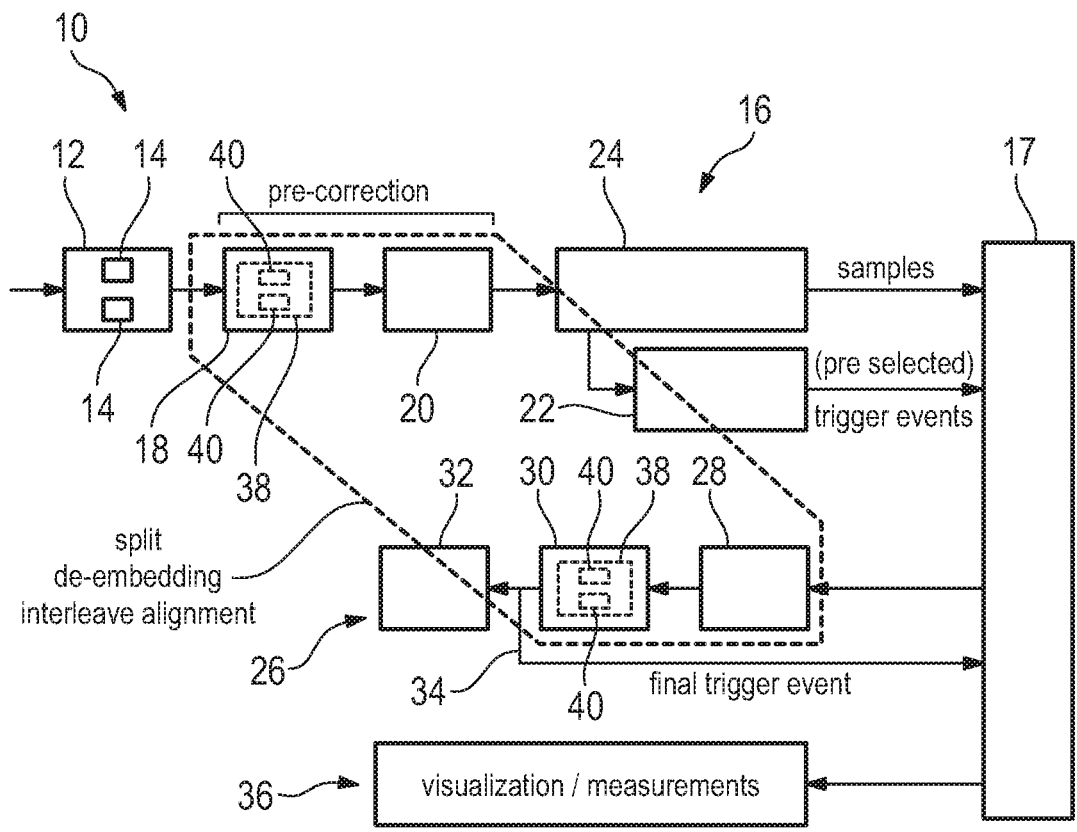
FIG. 1 schematically shows a representative signal analyzer according to an embodiment of the present disclosure.

FIG. 1 schematically shows a signal analyzer 10 that comprises a frontend 12 that has at least two interleaved digitizers 14, namely two time-interleaved digitizers. The signal analyzer 10 receives via its frontend 12 an input signal that is processed by the digitizers 14 such that the input signal is digitized in order to obtain a digitized input signal. Put differently, the digitizers 14 generated samples, namely sampled values, that are further processed by the signal analyzer 10.

The signal analyzer 10 has an acquisition path 16 for acquiring the respective samples generated by the digitizers 14. The acquisition path 16 is located between the frontend 12 and an acquisition memory 17 that is configured to store a signal assigned to the input signal, namely a representative of the input signal, thereby generating an acquired signal. However, the signal is pre-processed in the acquisition path 16 as will be described hereinafter.

In an embodiment, the signal analyzer 10 comprises a first interleave alignment filter 18 that receives the digitized input signal from the frontend 12, namely the sampled values. The first interleave alignment filter 18 is established by a hardware interleave alignment filter that hardware-compensates non-ideal effects of the frontend 12 in the digitized input signal, for example those ones introduced by the digitizers 14 when digitizing the input signal. The first interleave alignment filter 18 is configured to hardware-compensate these non-ideal effects in real-time. The first interleave alignment filter 18 generates a hardware-compensated, digitized input signal. In an embodiment, the first interleave alignment filter 18 includes one or more circuits.

In the shown embodiment, a first de-embedding filter 20 is provided that is located downstream of the first interleave alignment filter 18, which receives the hardware-compensated, digitized input signal outputted by the first interleave alignment filter 18. The first de-embedding filter 20 is established by a hardware de-embedding filter that de-embeds the respective signal received in real-time. Accordingly, the first de-embedding filter 20 generates a hardware de-embedded, hardware-compensated, digitized input signal when processing the hardware-compensated, digitized input signal received from the first interleave alignment filter 18. In an embodiment, the first de-embedding filter 20 includes one or more circuits.

However, the first de-embedding filter 20 is an optional component, as de-embedding is generally done to compensate any parasitic effects that may be introduced by (external) components used to receive the input signal, for instance adapters, connectors, wires, cables, and so on.

The first interleave alignment filter 18 as well as the first de-embedding filter 20 both are located in the acquisition path 16.

The signal analyzer 10 also comprises a first trigger unit 22 as well as an optional further module 24, which are also located in the acquisition path 16. In the shown embodiment, the first trigger unit 22 is located downstream of the first interleave alignment filter 18, the optional first de-embedding filter 20 as well as the optional further module 24. Therefore, the first trigger unit 22 receives the hardware-compensated, digitized input signal that may be further processed by the first de-embedding filter 20 and/or the further module 24. Hence, the first trigger unit 22 may receive a hardware de-embedded, hardware-compensated, digitized input signal provided that the first de-embedding filter 20 is provided as shown in FIG. 1. In an embodiment, the optional further module 24 includes one or more circuits.

The first trigger unit 22 is established by a hardware trigger unit that is configured to process the respective signal in real-time. The first trigger unit 22 is connected upstream of the acquisition memory 17, namely interconnected between the first interleave alignment filter 18 and the acquisition memory 17. In an embodiment, the first trigger unit 22 includes one or more circuits.

The first trigger unit 22 applies a trigger on the signal received in order to generate trigger events that are used to trigger the acquisition memory 17 that simultaneously receives the samples processed within the acquisition path 16. Hence, acquisition of the samples is triggered provided that the first trigger unit 22 outputs a trigger event such that the acquisition memory 17 generates an acquired signal when storing the respective samples.

The hardware trigger unit 22 receives the pre-corrected signal, namely the one processed by the first interleave alignment filter 18 and optionally the first de-embedding filter 20. This pre-correction provides that the data basis is improved compared to raw data associated with the input signal. Hence, the relevance of the acquired samples is improved even though the real-time processing does not allow a complete correction of the respective signal. In other words, the respective pre-selection of the trigger events that is done by the first trigger unit 22 already has a high accuracy, as the first trigger unit 22 receives the already hardware-compensated (and optionally hardware de-embedded) digitized input signal.

In addition, the signal analyzer 10 has a first post-processing path 26. The first post-processing path 26 comprises a second de-embedding filter 28 that is located downstream of the acquisition memory 17. Thus, the second de-embedding filter 28 receives the acquired signal from the acquisition memory 17. The second de-embedding filter 28 is established by a fine de-embedding filter, which is configured to fine de-embed the acquired signal in a post-processing step of the acquired signal. This can be done since the fine de-embedding takes place in the post-processing that is less time critical compared to the pre-processing, namely the real-time processing of the respective signal in the acquisition path 16. In an embodiment, the second de-embedding filter 28 can include one or more circuits. In another embodiment, the one or more circuits can include a microprocessor programmed with suitable software for implementing the second de-embedding filter.

Further, a second interleave alignment filter 30 is provided in the first post-processing path 26, which is located downstream of the second de-embedding filter 28. The second interleave alignment filter 30 fine-compensates further non-ideal effects of the frontend 12, for example the digitizers 14, in a post-processing of the acquired signal. The second interleave alignment filter 30 applies a fine compensation of these further non-ideal effects that have not been compensated previously during the (rough) correction done by the first interleave alignment filter 18 due to the temporal restrictions associated with the real-time processing. In an embodiment, the second interleave alignment filter 30 can include one or more circuits. In another embodiment, the one or more circuits can include a microprocessor programmed with suitable software for implementing the second interleave alignment filter.

Since the second interleave alignment filter 30 is located downstream of the second de-embedding filter 28, it is ensured that the second interleave alignment filter 30 processes an already fine de-embedded acquired signal.

In addition, the first post-processing path 26 also comprises a second trigger unit 32 that is located downstream of the second interleave alignment filter 30. The second trigger unit 32 is established by a digital trigger that applies a trigger on the signal received in a digital manner, namely the compensated, de-embedded acquired signal. The digital trigger can be implemented in either software, hardware, or a combination of software and hardware.

The compensated, de-embedded acquired signal may also be called fine compensated, fine de-embedded acquired signal, as the respective corrections done by the second de-embedding filter 28 and the second interleave alignment filter 30 ensure an ideal correction of the acquired signal.

Accordingly, the second trigger unit 32 applies its trigger on the ideally corrected signal, namely the compensated, de-embedded acquired signal. In some embodiments, the second trigger unit 32 applies the same trigger as the first trigger unit 22.

The second trigger unit 32 verifies whether or not the (pre-selected) trigger events are still valid even after the fine compensation done by the second interleave compensation filter 30 in the post-processing of the acquired signal.

The results of the first post-processing path 26 are forwarded to the acquisition memory 17 again by a return path 34 such that the acquisition data in the acquisition memory 17 can be amended based on the results of the first post-processing path 26.

If the second trigger unit 32 verifies that the (pre-selected) trigger events are still valid, a possible adaption/correction of them will take place, namely a finer calculation of their respective timings, resulting in an adapted acquired signal or adapted acquisition data.

If the second trigger unit 32 verifies that these (pre-selected) trigger events are not valid anymore, they (together with the respective acquisition data) will be discarded from the acquisition memory 17.

The signal analyzer 10 also comprises at least a second post-processing path 36 that is assigned to the acquisition memory 17 in order to post-process the adapted acquisition data in a known manner. This means that the respective adapted acquisition data can be visualized or measurements are performed on the adapted acquisition data.

In some embodiments, the first interleave alignment filter 18 and/or the second interleave alignment filter 28 comprise(s) a periodically time-variant filter 38 as indicated by the dashed lines in FIG. 1. The periodically time-variant filter 38 may comprise several compensation filters 40. For instance, each of the interleaved digitizers 14 is assigned to a dedicated compensation filter 40. The sampled values (samples) generated by the digitizers 14 are forwarded to the periodically time-variant filter 38, wherein each individual compensation filter 40 supplies only compensated samples in an associated polyphase of the digitized input signal.

Figure 2:
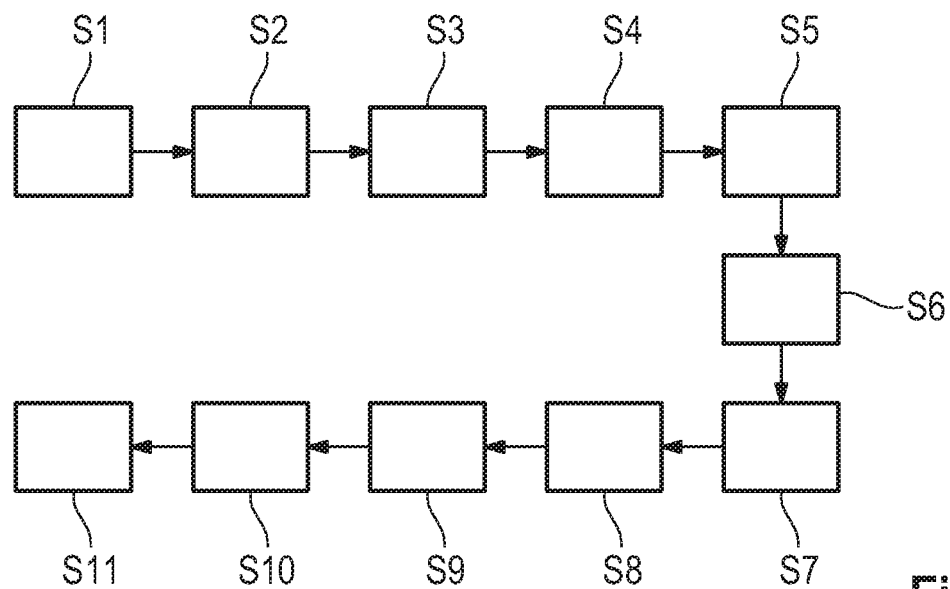
FIG. 2 shows a flow-chart of a representative method of analyzing a signal according to an embodiment of the present disclosure.

In some embodiments, the signal analyzer 10 shown in FIG. 1 is configured to perform the representative method schematically illustrated in FIG. 2, which is described hereinafter with reference to FIG. 2.

In a first step S1, an input signal is received by the frontend 12 of the signal analyzer 10. In a second step S2, the input signal is processed by the digitizers 14 of the frontend 12, thereby generating the digitized input signal, namely sampled values or rather samples. In a third step S3, the digitized input signal is filtered by the first interleave alignment filter 18.

Thus, non-ideal effects of the frontend 12 in the digitized input signal are hardware-compensated in real-time at least partly, wherein the hardware-compensated, digitized input signal is generated.

In a fourth step S4, the hardware-compensated, digitized input signal is hardware de-embedded in real-time by the first de-embedding filter 20, thereby generating the hardware de-embedded, hardware-compensated, digitized input signal.

Generally, the hardware-compensation as well as the hardware de-embedding both are performed in real-time and, therefore, they relate to a rough correction of the respective signal.

In a fifth step S5, the hardware de-embedded, hardware-compensated, digitized input signal is forwarded to the first trigger unit 22 that applies the trigger on the signal received, thereby generating trigger events. In a sixth step S6, the samples assigned to the input signal are acquired by the acquisition memory 17 based on the trigger events received from the first trigger unit 22. When storing these samples, the acquired signal is generated by the acquisition memory 17.

In a seventh step S7, the acquired signal is de-embedded by means of the second de-embedding filter 28 in a post-processing step. The second de-embedding filter 28 applies a fine de-embedding on the acquired signal, for example compared to the (rough) de-embedding performed by the first de-embedding filter 20. The second de-embedding filter 28 generates a de-embedded acquired signal that may also be called fine de-embedded acquired signal.

In an eighth step S8, the de-embedded acquired signal is forwarded to and processed by the second interleave alignment filter 30 that fine-compensates any further effects of the frontend 12 that have not been compensated by the first de-embedding filter 20. Thereby, the second interleave alignment filter 30 generates a compensated, de-embedded acquired signal, which may also be called fine compensated, fine de-embedded acquired signal, as the second interleave alignment filter 30 applies a fine compensation of the further effects of the frontend 12.

Accordingly, the second de-embedding filter 28 and the second interleave alignment filter 30 together ensure an ideal correction of the acquired signal.

In a ninth step S9, the compensated, de-embedded acquired signal is forwarded to the second trigger unit 32 that applies the trigger on the respective signal in order to verify the (pre-selected) trigger events of the first trigger unit 22. For instance, the second trigger unit 32 fine-calculates the timings of the respective trigger events found by the first trigger unit 22 or discards the previously identified trigger events provided that it has been verified that the (pre-selected) trigger events are not valid anymore.

Accordingly, the corrections made in the acquisition path 16 by the first interleave alignment filter 18 and the first de-embedding filter 20 yield a pre-corrected signal that is used by the first trigger unit 22 in order to pre-select trigger events for acquisition. The pre-correction ensures an improved data basis for the acquisition.

In the post-processing of the already acquired data, namely the acquisition data, the second trigger unit 32 applies the same trigger or an associated trigger on the acquisition data that is corrected in an ideal manner by means of the second de-embedding filter 28 and the second interleave alignment filter 30 during the post-processing of the acquired signal.

The efforts required for post-processing are reduced due to the pre-selection done in the acquisition path 16 in real-time such that the post-processing is improved.

In a tenth step S10, the first post-processing path 26 forwards its results, namely the final trigger results from the second trigger unit 32, to the acquisition memory 17 that adapts the acquisition data in an appropriate manner. For instance, the timings of the trigger events are adapted after their fine calculation, or certain pre-selected trigger events and the samples associated thereto are discarded.

In an eleventh step S11, a further post-processing of the adapted acquisition data is done, which is stored in the acquisition memory 17, for instance visualizing the adapted acquisition data or performing a measurement on the adapted acquisition data.

The signal analyzer 10 splits the respective corrections, as the de-embedding as well as the interleave alignment are done in real-time on a hardware basis in the acquisition path 16 and additionally in a post-processing of the already acquired data during a post-processing.

In any case, the acquisition is based on pre-corrected data in order to reduce the probability of false acquisition while simultaneously ensuring real-time acquisition.

Generally, a combined acquisition and post-processing de-embedding and interleave alignment filtering is provided, as the de-embedding and the interleave alignment filtering is split into two portions assigned to the acquisition and the post-processing.

Certain embodiments disclosed herein utilize circuitry (e.g., one or more circuits) in order to implement protocols, methodologies or technologies disclosed herein, operably couple two or more components, generate information, process information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analyzer for analyzing a signal, said signal analyzer comprising
    a frontend with at least two interleaved digitizers configured to digitize an input signal, thereby generating a digitized input signal;
    a first interleave alignment filter established by a hardware interleave alignment filter that is configured to hardware-compensate non-ideal effects of said frontend in said digitized input signal in real-time, thereby generating a hardware-compensated, digitized input signal;
    an acquisition memory configured to store said hardware-compensated, digitized input signal, thereby generating an acquired signal; and
    a second interleave alignment filter configured to fine-compensate further non-ideal effects of said frontend in a post-processing of said acquired signal.

2. The signal analyzer according to claim 1, wherein said first interleave alignment filter is interconnected between said frontend and said acquisition memory.

3. The signal analyzer according to claim 1, wherein said acquisition memory is interconnected between said first interleave alignment filter and said second interleave alignment filter.

4. The signal analyzer according to claim 1, wherein said signal analyzer comprises a first trigger unit established by a hardware trigger unit that is interconnected between said first interleave alignment filter and said acquisition memory.

5. The signal analyzer according to claim 1, wherein said signal analyzer comprises a second trigger unit established by a fine trigger unit that is connected downstream of said acquisition memory.

6. The signal analyzer according to claim 1, wherein said signal analyzer comprises a first de-embedding filter established by a hardware de-embedding filter that is interconnected between said first interleave alignment filter and said acquisition memory.

7. The signal analyzer according to claim 4, wherein said signal analyzer comprises a first de-embedding filter established by a hardware de-embedding filter that is interconnected between said first interleave alignment filter and said first trigger unit.

8. The signal analyzer according to claim 1, wherein said signal analyzer comprises a second de-embedding filter established by a fine de-embedding filter that is connected downstream of said acquisition memory.

9. The signal analyzer according to claim 8, wherein said second de-embedding filter is interconnected between said acquisition memory and said second interleave alignment filter.

10. The signal analyzer according to claim 8, wherein said signal analyzer comprises a second trigger unit established by a fine trigger unit, said second interleave alignment filter being interconnected between said second trigger unit and said second de-embedding filter.

11. The signal analyzer according to claim 1, wherein at least one of said first interleave alignment filter and said second interleave alignment filter comprises a periodically time-variant filter.

12. A method of analyzing a signal, said method comprising the steps of:
    receiving an input signal by a frontend of a signal analyzer;
    digitizing said input signal by said frontend, thereby generating a digitized input signal;
    filtering said digitized input signal by a first interleave alignment filter in order to hardware-compensate non-ideal effects of said frontend in said digitized input signal in real-time, thereby generating a hardware-compensated, digitized input signal;
    storing said hardware-compensated, digitized input signal by an acquisition memory, thereby generating an acquired signal; and
    filtering said acquired signal by a second interleave alignment filter in order to fine-compensate further non-ideal effects of said frontend in a post-processing of said acquired signal.

13. The method according to claim 12, wherein said hardware-compensated, digitized input signal is hardware de-embedded by a first de-embedding filter, thereby generating a hardware de-embedded, hardware-compensated, digitized input signal.

14. The method according to claim 13, wherein a trigger is applied on said hardware de-embedded, hardware-compensated, digitized input signal by a first trigger unit, thereby generating trigger events.

15. The method according to claim 14, wherein samples of said hardware de-embedded, hardware-compensated, digitized input signal are acquired by said acquisition memory based on said trigger events, thereby generating said acquired signal.

16. The method according to claim 12, wherein said acquired signal is de-embedded by a second de-embedding filter, thereby generating a de-embedded acquired signal.

17. The method according to claim 16, wherein said de-embedded acquired signal is filtered by said second interleave alignment filter, thereby generating a compensated, de-embedded acquired signal.

18. The method according to claim 17, wherein a trigger is applied on said compensated, de-embedded acquired signal by a second trigger unit, thereby generating final trigger results.

19. The method according to claim 18, wherein at least one of said compensated, de-embedded acquired signal and said trigger results are forwarded to said acquisition memory.

20. The method according to claim 12, wherein acquisition data is further post-processed.

* * * * *